(12) United States Patent
Moon

(10) Patent No.: US 6,475,891 B2
(45) Date of Patent: Nov. 5, 2002

(54) METHOD OF FORMING A PATTERN FOR A SEMICONDUCTOR DEVICE

(75) Inventor: Hong-Bae Moon, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/984,949

(22) Filed: Oct. 31, 2001

(65) Prior Publication Data

US 2002/0068447 A1 Jun. 6, 2002

(30) Foreign Application Priority Data

Dec. 4, 2000 (KR) ............................................ 00-73011

(51) Int. Cl.$^7$ .............................................. H01L 21/44
(52) U.S. Cl. ........................ 438/584; 438/597; 438/639; 438/696
(58) Field of Search ................................ 438/596, 597, 438/584, 639, 696, 595

(56) References Cited

U.S. PATENT DOCUMENTS

| | | | | |
|---|---|---|---|---|
| 5,942,787 A | * | 8/1999 | Gardner et al. | 257/408 |
| 6,063,688 A | * | 5/2000 | Doyle et al. | 438/424 |
| 6,110,773 A | * | 8/2000 | Lee | 438/238 |
| 6,140,217 A | * | 10/2000 | Jones et al. | 438/597 |

OTHER PUBLICATIONS

Wolf, S., Silicon Processing for the VLSI Era, vol. 2, Lattice Press, 1990, pp. 189–194.*

* cited by examiner

Primary Examiner—T. N. Quach
(74) Attorney, Agent, or Firm—Lee & Sterba, P.C.

(57) ABSTRACT

A method of forming a pattern for a semiconductor device without using a photolithography technique is disclosed, wherein the method includes forming a sacrificial layer on a semiconductor substrate, forming a sacrificial layer pattern by patterning the sacrificial layer, forming a conformal layer on a resultant structure after forming the sacrificial layer pattern, and forming the layer pattern by anisotropically etching the conformal layer.

16 Claims, 6 Drawing Sheets

METHOD OF FORMING A PATTERN FOR A SEMICONDUCTOR DEVICE

BACKGROUND OF THE INVENTION

1. Field of the Invention

The present invention relates to a method of forming a pattern for a semiconductor device. More particularly, the present invention relates to a method of forming a fine pitch pattern having a feature width under several tens of nanometers for a semiconductor device using sacrificial layer patterns.

2. Description of the Related Art

As semiconductor devices become increasingly integrated for economic efficiency, the design rule of the devices becomes smaller. Therefore, the topological dimensions for a pattern for the semiconductor devices decrease, and the minimum line width is reduced to a range of several hundreds to several tens of nanometers. Recently, pattern miniaturization and integration of semiconductor devices has been highly dependent upon developments in photolithography. That is, due to the resolution limit obtainable with the equipment and materials used thus far in the photolithography process, the amount of pattern miniaturization and integration possible in semiconductor devices has been limited.

Several problems associated with a conventional method of forming patterns for semiconductor devices are disclosed hereinafter.

As shown in FIG. 1A, a base layer 12 acting as an interlayer insulation film 12 is formed on a semiconductor substrate 10. A layer 13, to be a predetermined pattern, is formed on the base layer 12, and subsequently a photoresist film (not shown) is formed on the layer 13. Then, as shown in FIG. 1B, a photoresist film pattern 16 is formed by exposing and developing the photoresist film. Next, as shown in FIG. 1C, the layer 13 is partially etched to expose the base layer 12 using the photoresist film pattern 16 as an etching mask, so that predetermined pattern layers 13a, 13b, such as metal wires or gate electrodes, are formed.

Ordinarily, fine pitch patterns are formed in a memory cell region while large pitch patterns are formed in a peripheral region relative to the memory cell region. Therefore, the resolution capability of a photoresist film must be enhanced in order to form the fine pitch patterns. This resolution requirement defines the need for a feature of the present invention.

The resolution capability of a photoresist film is usually improved by employing a light source having a short wavelength, or by incrementing a numerical aperture (NA) of a lens. With respect to the light source, a DUV (deep ultraviolet) light source such as KrF (248 nm) or ArF (193 nm) having a wavelength shorter than G-line (436 nm) or I-line (365 nm) has been used, and an X-ray light source is being developed.

Moreover, there have been other attempts to form the fine pitch patterns for semiconductor devices, such as modifying a mask pattern into a phase shift mask (PSM) to prevent imprecise pattern formation due to an optical proximity effect, or employing an off axis illumination method.

However, the various approaches described above for forming fine pitch patterns in a memory cell, photolithography using a DUV or X-ray light source, modifying a mask pattern into PSM, and employing an off axis illumination method, require costly manufacturing equipment and a process that is more precisely controlled and complicated than that of conventional photolithography techniques. For instance, using a DUV or an X-ray as a light source requires new photoresist materials that are sensitive to the short wavelength of the DUV or the X-ray. Moreover, using the X-ray as a light source requires development of a new opaque material to obstruct transmission of the X-ray used in an X-ray photolithography process.

As a result, expensive equipment and complicated process conditions are necessary to form fine pitch patterns by means of the photolithography process, thereby increasing the manufacturing costs for a semiconductor device while decreasing the productivity thereof.

In addition, up until now, highly integrated semiconductor devices having miniaturized patterns have not been attainable with a conventional photolithography process, hence the alternate, more costly approaches described above.

SUMMARY OF THE INVENTION

It is, therefore, a feature of an embodiment of the present invention to provide a method for forming a pattern of a semiconductor device using sacrificial layer patterns.

It is another feature of an embodiment of the present invention to provide a method of forming a pattern for semiconductor devices using the conventional photolithography process, wherein the pattern preferably has a line width under several tens of nanometers.

It is yet another feature of an embodiment of the present invention to provide a method of forming patterns for a semiconductor device, comprising forming a first pattern, preferably of minimum line width under several tens of nanometers, and a second pattern having a line width relatively greater than that of the first pattern by combining a photolithography process and a non-photolithography process.

In order to provide the above features of the present invention, according to an embodiment of the present invention, there is provided a method of forming a pattern for a semiconductor device comprising forming a sacrificial layer on a semiconductor substrate, forming a sacrificial layer pattern by patterning the sacrificial layer, forming a conformal layer on a resultant structure after forming the sacrificial layer pattern, and forming a layer pattern by anisotropically etching the conformal layer.

In addition, a base layer may be formed between the semiconductor substrate and the sacrificial layer.

In a method according to an embodiment of the present invention, the sacrificial layer is formed from a material having a high etching selectivity to the conformal layer and the semiconductor substrate, wherein the sacrificial layer is preferably formed of silicon nitride.

In the method according to an embodiment of the present invention, the conformal layer is preferably a conductive layer formed of a material from the group consisting of aluminum, tungsten, cobalt, copper, titanium and polysilicon. Further, the conformal layer may be a polycide double layer including a polysilicon layer and a silicide layer, or a multilayer, the multilayer being formed of films selected from the group consisting of a titanium film, an aluminum film, and a titanium nitride film.

In the method according to an embodiment of the present invention, the method further includes planarizing an upper surface of the sacrificial layer pattern and the layer pattern after forming the layer pattern.

In the method according to an embodiment of the present invention, the method further includes removing the sacrificial layer pattern by means of a wet etching process after forming the layer pattern.

According to another embodiment of the present invention, there is provided a method of forming patterns for semiconductor devices comprising forming a sacrificial layer on a semiconductor substrate having a cell region and a peripheral region; forming a sacrificial layer pattern on the semiconductor substrate of the cell region; forming a conformal layer on the entire surface of the semiconductor substrate including the sacrificial layer pattern; forming a photoresist pattern on the conformal layer formed at the peripheral region; and anisotropically etching the conformal layer to expose the semiconductor substrate, thereby forming a first pattern comprised of the conformal layer on the sidewalls of the sacrificial layer pattern at the cell region, and forming a second pattern beneath the photoresist patterns at the peripheral region, wherein the second pattern has a width relatively wider than that of the first patterns.

In addition, a base layer may be formed between the semiconductor substrate and the sacrificial layer.

In the method according to an embodiment of the present invention, the sacrificial layer is preferably formed of a material having a high etching selectivity to the semiconductor substrate, the base layer and the conformal layer.

In the method according to an embodiment of the present invention, the sacrificial layer is preferably formed of silicon nitride.

In the method according to an embodiment of the present invention, the conformal layer is preferably a conductive layer.

In the method according to an embodiment of the present invention, the conformal layer is preferably selected from the group consisting of aluminum, tungsten, cobalt, copper, titanium and polysilicon. The conductive layer may also be formed of a double layer comprised of a polysilicon layer and a suicide layer, or a multiplayer, the multilayer being formed of films selected from the group consisting of a titanium film, an aluminum film, and a titanium nitride film.

In the method according to an embodiment of the present invention, the method further includes planarizing an upper surface of the sacrificial layer pattern and the first and second patterns after anisotropically etching the layer.

In the method according to an embodiment of the present invention, the method further includes removing the sacrificial layer pattern by means of a wet etching process after anisotropically etching the layer.

In the method according to an embodiment of the present invention, the sacrificial layer pattern is formed at the cell region and the peripheral region, respectively; during forming the sacrificial layer pattern, the photoresist film pattern is formed on the layer at the peripheral region, and while the second pattern is formed beneath the photoresist film pattern during anisotropic etching of the layer, a dummy pattern is formed on sidewalls of the sacrificial layer pattern at the peripheral region.

These and other features of the present invention will be readily apparent to those of ordinary skill in the art upon review of the detailed description of the preferred embodiments that follows.

BRIEF DESCRIPTION OF THE DRAWINGS

The above and other features and advantages of the present invention will become more apparent from the following detailed description when taken in conjunction with the accompanying drawings in which.

DETAILED DESCRIPTION OF THE PREFERRED EMBODIMENTS

Korean Patent Application No. 2000-73011, filed on Dec. 4, 2000, and entitled: "Method of Forming a Pattern for Semiconductor Devices," is incorporated by reference herein in its entirety.

The present invention will be described more fully hereinafter with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those of ordinary skill in the art. Like numbers refer to like elements throughout.

Figure 1A:
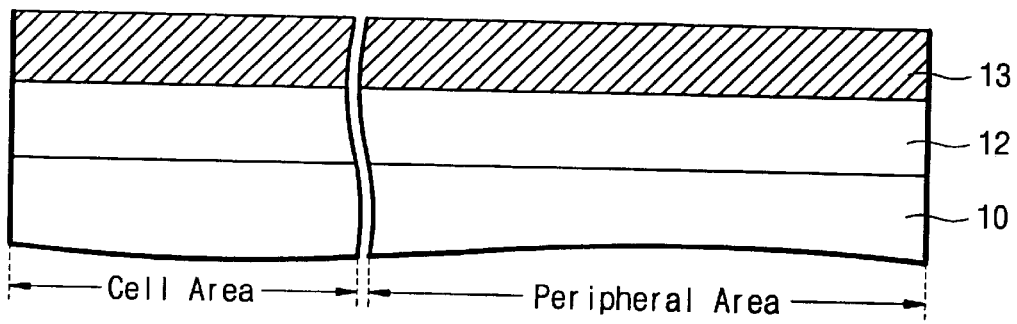
FIGS. 1A through 1C illustrate cross-sectional views of a semiconductor device for sequentially showing a method of forming patterns for semiconductor devices in accordance with the prior art.
Figure 1B:
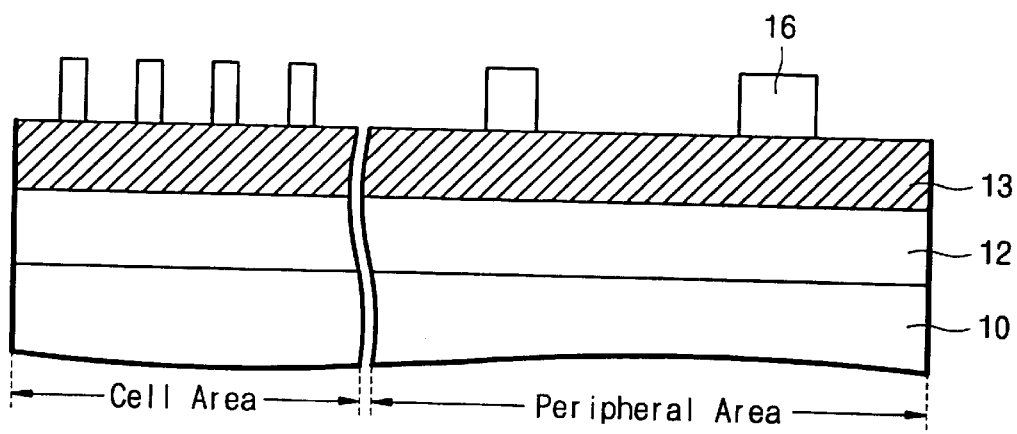
Figure 1C:
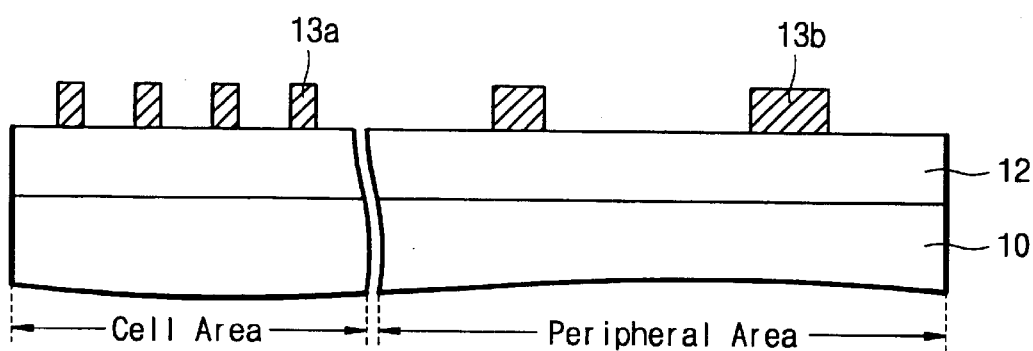
Figure 2:
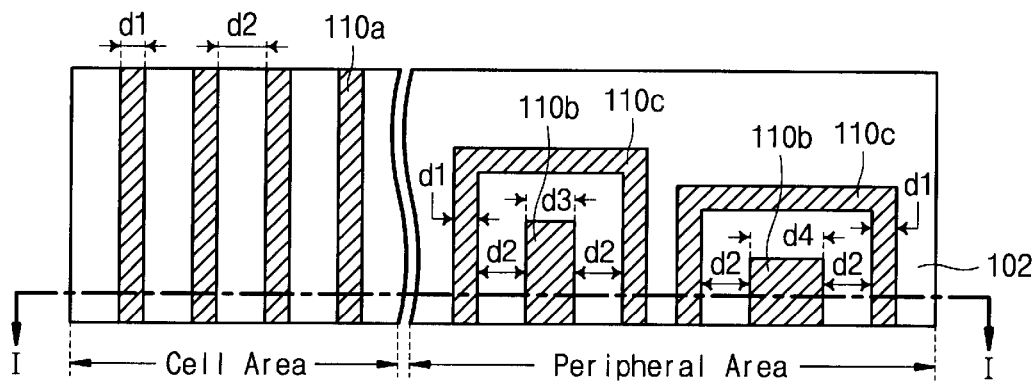
FIG. 2 illustrates a plan view of a semiconductor device showing patterns to be formed in accordance with an embodiment of the present invention.

FIG. 2 shows patterns to be formed in accordance with an embodiment of the present invention, and FIGS. 3A through 3G illustrate cross-sectional views taken along line I—I in FIG. 2 for showing a method of forming patterns for semiconductor devices in accordance with an embodiment of the present invention.

Referring to FIG. 2, a semiconductor substrate is covered with a base layer 102. First patterns 110a, second patterns 110b and dummy patterns 110c are arranged on the base layer 102. The first patterns 110a are arranged across the cell region of the semiconductor substrate such that they are equally spaced apart. The second patterns 110b are formed in the peripheral region. The second patterns 110b have a line width greater than that of the first patterns 110a and dummy patterns 110c. Each of the second patterns 110b is surrounded by a dummy pattern 110c. Dummy patterns 110c are formed to reduce the step height difference between the cell region and the peripheral region. The line width d1 of first patterns 110a formed in the cell region is the same width as the dummy patterns 110c formed in the peripheral region. The second patterns 110b formed in the peripheral region have line widths d3, d4, each of which is wider than the line width d1 of the first patterns 110a and the dummy patterns 110c. Distances d2 between each of patterns 110a, 110b, 110c are equal.

Now, a method of forming patterns in accordance with an embodiment of the present invention will be described below with reference to FIGS. 3A through 3G.

Figure 3A:
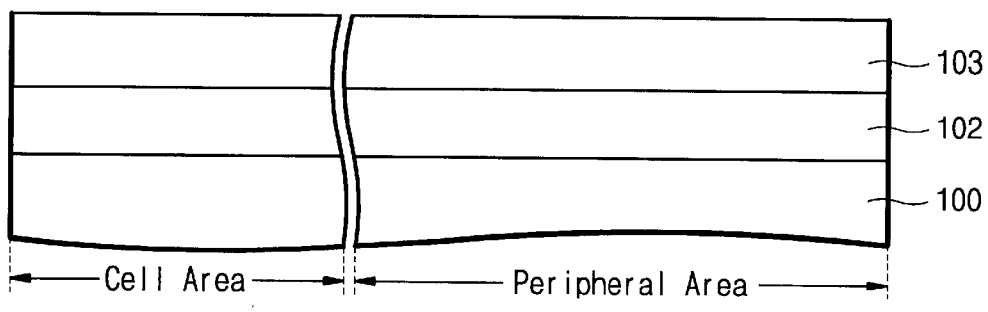
FIGS. 3A through 3G illustrate cross-sectional views of a semiconductor device showing a method of forming patterns for a semiconductor device in accordance with an embodiment of the present invention.

As shown in FIG. 3A, a base layer 102 acting as an interlayer insulation film is formed on a semiconductor substrate 100. The base layer 102 is preferably formed of silicon oxide. Next, a sacrificial layer 103 is formed on the base layer 102. The sacrificial layer 103 is preferably formed of a material that has a high etching selectivity to the base layer 102. For instance, if silicon oxide is used as a base layer 102, a sacrificial layer 103 is formed from silicon nitride. A thickness of the sacrificial layer 103 is determined according to a thickness of a pattern layer to be formed in accordance with the present invention.

Figure 3B:
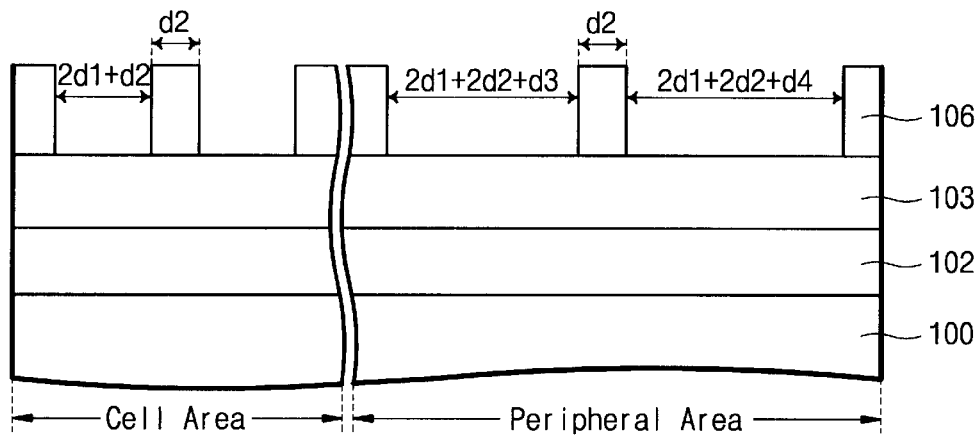

Next, as shown in FIG. 3B, a photoresist film (not shown) is formed on the sacrificial layer 103 and then patterned to be first photoresist film patterns 106, which are used as a mask for etching the sacrificial layer 103.

The first photoresist film patterns 106 are formed by considering the line widths d1, d3, d4 of the first, second and dummy patterns 110a, 110b, and 110c, respectively, and the distance d2 between each of the patterns shown in FIG. 2.

In a preferred embodiment of the present invention, the sacrificial layer 103, as opposed to the photolithography technique, is used to form the first patterns 110a and the dummy patterns 110c. The second patterns 110b, however, are formed by means of a photolithography technique.

Therefore, a shape and size of the first photoresist film patterns 106 are determined by considering the subsequent processes.

A line width of the first photoresist film pattern 106 is the same as the distance d2 between each of the patterns. Accordingly, the line width of the photoresist film patterns 106 is indicated by d2. Further, in the cell region, the first photoresist film patterns 106 having the line width d2 are formed at intervals of the two first patterns 110a. Thus, a distance between each of the first photoresist film patterns 106 in the cell region preferably corresponds to a value of (2l+d2).

On the other hand, in the peripheral region, the first photoresist film patterns 106 are not formed to cover areas in which the second patterns 110b, the dummy patterns 110c and the separating area between the second patterns 110b and the dummy patterns 110c would be formed. That is, the first photoresist film patterns 106 are formed between each of the dummy patterns 110c in the peripheral region. Thus, a distance between each of the first photoresist film patterns 106 in the peripheral region corresponds to a total value of (2l+2d 2+d3), or (2l+2d 2+d4).

Figure 3C:
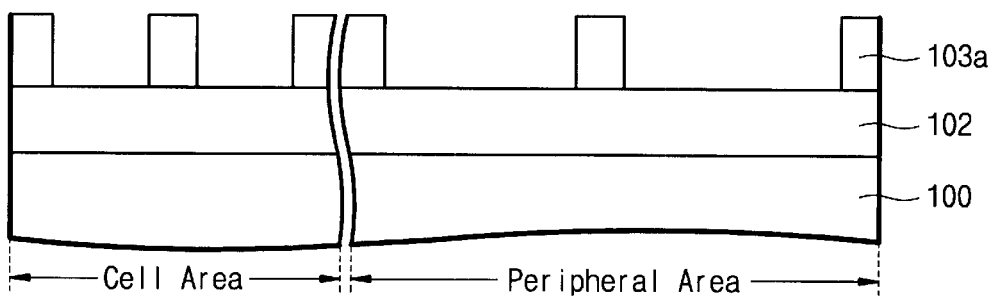

Next, as shown in FIG. 3C, the sacrificial layer 103 is dry etched using the first photoresist film pattern 106 as a mask, so that a sacrificial layer pattern 103a is formed.

Figure 3D:
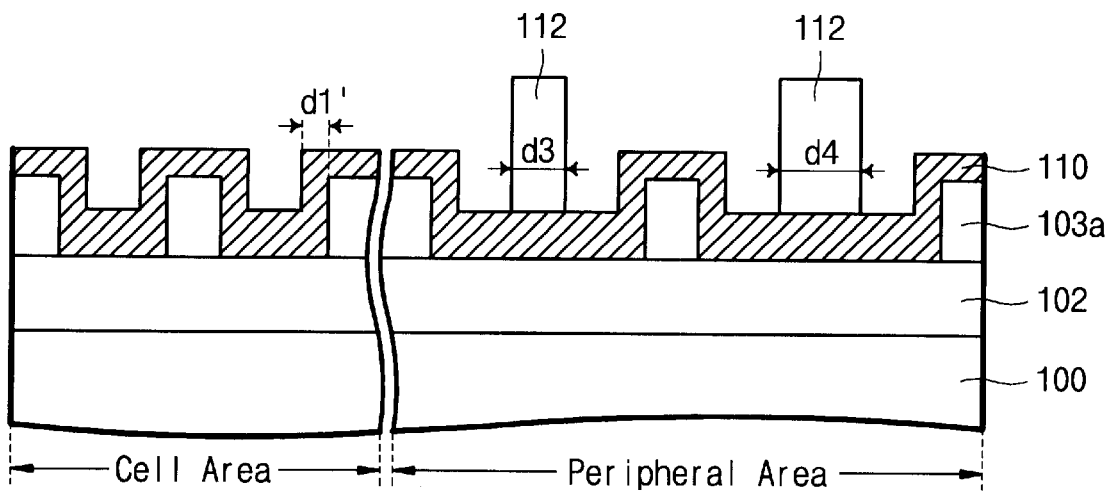

Next, as shown in FIG. 3D, a conformal layer 110, to be used for predetermined layer patterns in accordance with an embodiment the present invention, is formed on the entire upper surface of the resultant structure shown in FIG. 3C. That is, the conformal layer 110 covers all of the sacrificial layer pattern 103a and the base layer 102. The conformal layer 110 may be formed of a conductive material such as aluminum (Al), tungsten (W), copper (Cu), cobalt (Co), titanium (Ti), other metal compounds, or polysilicon. The conformal layer 110 may also be formed of a double layer called a polycide comprised of a polysilicon layer and a silicide layer. Alternatively, the conformal layer 110 may be formed of a multilayer comprised of titanium film, titanium nitride film, aluminum film and titanium nitride film. The material for the conformal layer 110 is determined according to a function of the layer patterns. For instance, when using the layer patterns as a metal wire, aluminum or tungsten is a proper material for the conformal layer 110. On the other hand, when using the layer patterns as a gate electrode, a silicide is proper.

A width d1' of the conformal layer 110 formed on sidewalls of the sacrificial layer patterns 103a is preferably the same as the width d1 of the first patterns 110a. Accordingly, the thickness d1' of the conformal layer 110 is formed to equal the width d1 of the first patterns 110a.

Next, second photoresist film patterns 112 are formed on the conformal layer 110 at the peripheral of the semiconductor substrate. The second photoresist film pattern 112 is a mask for forming the second patterns in the peripheral region. Accordingly, a width of each of the second photoresist film patterns 112 is preferably d3 or d4.

Figure 3E:
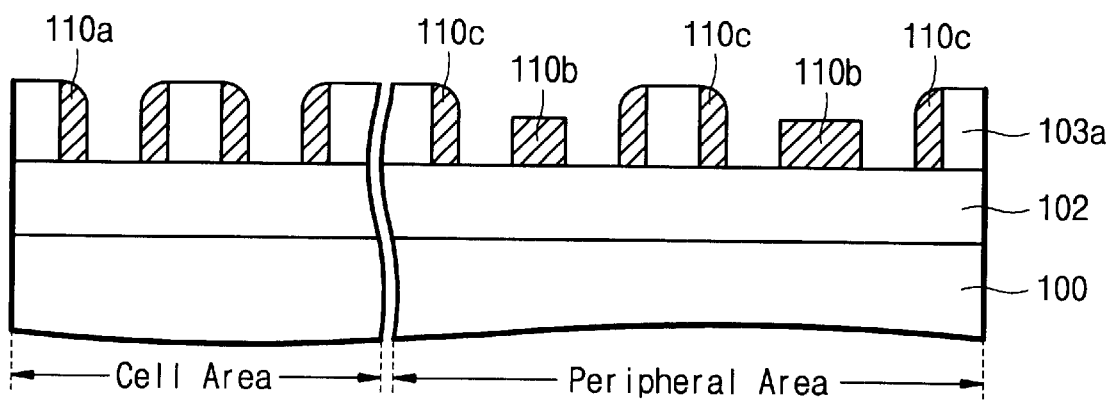
Figure 3F:
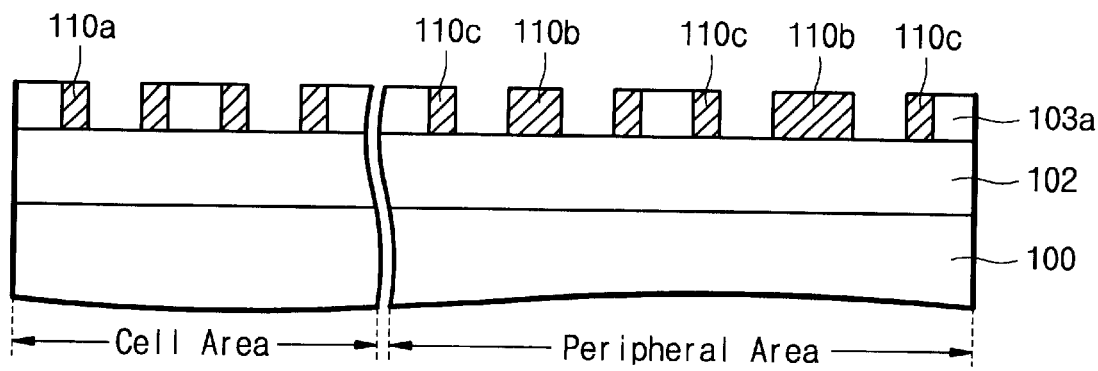

Next, as shown in FIGS. 3E and 3F, the conformal layer 110 is anisotropically etched, using the second photoresist film patterns 112 as an etching mask, to expose the base layer 102. Subsequently, the second photoresist film patterns 112 are removed by means of an oxygen plasma ashing process after which the resultant structure is rinsed. As a result, in the cell region, layer patterns 110a formed from the conformal layer 110 remain on the sidewalls of the sacrificial layer pattern 103a because the conformal layer 110 is etched without an etching mask. The layer patterns 110a in the cell region correspond to the first patterns 110a shown in FIG. 2. On the other hand, in the peripheral region, layer patterns 110c remain on the sidewalls of the sacrificial layer pattern 103a, to be used as dummy patterns 110c, and at the same time layer patterns 110b are formed on the base layer 102. The layer patterns 110b correspond to the second patterns 110b shown in FIG. 2. After etching, however, an upper surface of the semiconductor substrate is uneven due to a different step height of the layer patterns 110a, 110b and 110c, so that a planarization process is needed.

Thus, as shown in FIG. 3F, the surface of the semiconductor substrate is planarized by means of a CMP (chemical mechanical polishing) technique.

However, the planarnization process may be omitted.

Figure 3G:
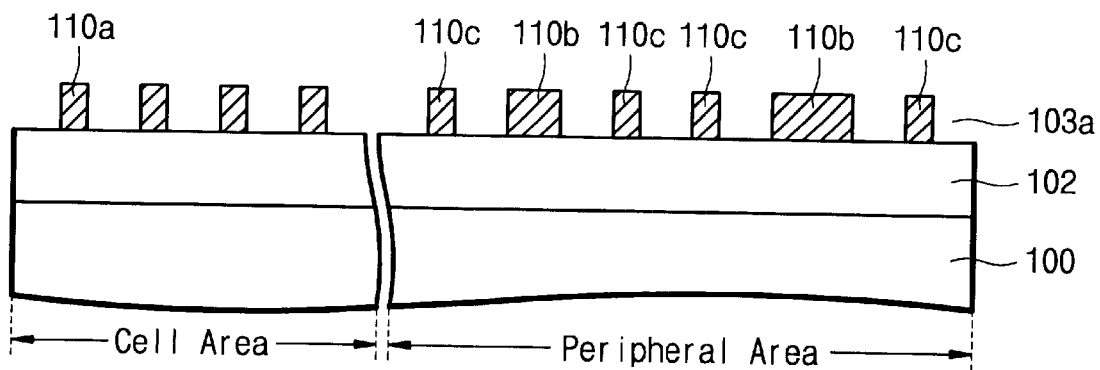

Next, as shown in FIG. 3G, the sacrificial layer pattern 103a are selectively removed by a wet etching process. As a result, only the layer patterns 110a, 110b, and 110c that correspond to the first and second patterns 110a, 110b and dummy patterns 110c remain on the base layer 102.

Alternatively, when forming an insulation layer on the patterns 110a, 110b and 110c after the planarization process, it is preferable to retain the sacrificial layer pattern 103a. However, the sacrificial layer pattern 103a must be removed when using the first and the second patterns 110a and 110b as a gate electrode.

As discussed above, rather than using the photolithography technique, which has been a limiting factor in the conventional miniaturization of patterns for semiconductor devices, the present invention provides a method of forming fine pitch patterns by using sacrificial layer patterns.

Therefore, by using the present invention, the cost of manufacturing highly integrated semiconductor devices can be reduced over the manufacturing cost when using short wavelength photolithography because the expensive equipment necessary for the short wavelength photolithography process is unwarranted in the present invention, and further, the process of manufacturing semiconductor devices is simplified by use of the present invention.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a layer pattern for a semiconductor device, comprising the steps of:

forming a sacrificial layer on a semiconductor substrate;

forming a sacrificial layer pattern by patterning the sacrificial layer;

forming a conformal layer on a resultant structure formed after the step of forming the sacrificial layer pattern;

forming the layer pattern by anisotropically etching the conformal layer; and planarizing an upper surface of the sacrificial layer pattern and the layer pattern.

2. A method as claimed in claim 1, wherein the sacrificial layer is formed of a material having a high etching selectivity to the conformal layer and the semiconductor substrate.

3. A method as claimed in claim 1, wherein the conformal layer is a conductive layer.

4. A method as claimed in claim 3, wherein the conformal layer is formed of a conductive material selected from the group consisting of aluminum, tungsten, copper, cobalt, titanium and polysilicon.

5. A method as claimed in claim 3, wherein the conformal layer is formed of a polycide double layer including a polysilicon layer and a silicide layer.

6. A method as claimed in claim 1, wherein the conformal layer is formed of a multilayer, the multilayer being formed of films selected from the group consisting of a titanium film, an aluminum film, and a titanium nitride film.

7. A method as claimed in claim 1, further comprising removing the sacrificial layer pattern by means of a wet etching process after forming the layer pattern.

8. A method of forming a pattern for a semiconductor device, comprising:

forming a sacrificial layer on a semiconductor substrate having a cell region and a peripheral region;

forming a sacrificial layer pattern on the semiconductor substrate of the cell region;

forming a conformal layer on the entire surface of the semiconductor substrate including the sacrificial layer pattern;

forming a photoresist pattern on the conformal layer formed at the peripheral region; and anisotropically etching the conformal layer to expose the semiconductor substrate, thereby forming a first pattern comprised of the conformal layer on sidewalls of the sacrificial layer pattern in the cell region and a second pattern beneath the photoresist pattern in the peripheral region, wherein the second pattern has a line width relatively greater than that of the first pattern.

9. The method of claim 8, wherein the sacrificial layer is formed of a material having a high etching selectivity to the semiconductor substrate and the conformal layer.

10. The method of claim 8, wherein the conformal layer is a conductive layer.

11. The method of claim 10, wherein the conformal layer is formed of a conductive material selected from the group consisting of aluminum, tungsten, cobalt, copper, titanium and polysilicon.

12. The method according to claim 10, wherein the conformal layer is formed of a polycide double layer including a polysilicon layer and a silicide layer.

13. The method according to claim 8, wherein the conformal layer is formed of a multilayer, the multilayer being formed of films selected from the group consisting of a titanium film, an aluminum film and a titanium nitride film.

14. The method according to claim 8, further comprising planarizing an upper surface of the sacrificial layer patterns and the first and second patterns after anisotropically etching the conformal layer.

15. The method according to claim 8, further comprising removing the sacrificial layer pattern by means of a wet etching process after anisotropically etching the conformal layer.

16. The method of claim 8, wherein the sacrificial layer pattern is formed at the cell region and the peripheral region, respectively; during forming the sacrificial layer pattern, the photoresist film pattern is formed on the conformal layer at the peripheral region, and while the second pattern is formed beneath the photoresist film pattern during anisotropic etching of the conformal layer, a dummy pattern is formed on sidewalls of the sacrificial layer pattern at the peripheral region.

* * * * *